United States Patent [19]

Yamamura et al.

[11] Patent Number: 5,338,988
[45] Date of Patent: Aug. 16, 1994

[54] VOLTAGE CONVERTING CIRCUIT WITH LOW CONSUMPTION DRIVER

[75] Inventors: Norihisa Yamamura, Tokyo; Kotaro Okada, Narashino, both of Japan

[73] Assignee: Motorola, Inc., Schaumburg, Ill.

[21] Appl. No.: 139,489

[22] Filed: Oct. 20, 1993

[30] Foreign Application Priority Data

Oct. 21, 1992 [JP] Japan ................... 4-305877

[51] Int. Cl.⁵ .......................................... H03K 17/687
[52] U.S. Cl. ............................... 307/578; 307/264; 307/296.1; 307/353
[58] Field of Search ............... 307/296.1, 296.3, 296.5, 307/296.6, 296.8, 264, 578, 570, 571, 353

[56] References Cited

U.S. PATENT DOCUMENTS

| | | | |
|---|---|---|---|
| 3,601,624 | 8/1971 | Hayes | 307/264 |
| 3,631,408 | 12/1971 | Kubo | 307/353 |
| 3,790,812 | 2/1974 | Fry | 307/296.1 |
| 4,061,929 | 12/1977 | Asano | 307/264 |
| 4,532,438 | 7/1985 | Reiner | 307/355 |
| 4,570,085 | 2/1986 | Redfield | 307/578 |
| 4,680,488 | 7/1987 | Okumura et al. | 307/264 |
| 5,148,054 | 9/1992 | Demler | 307/572 |
| 5,148,056 | 9/1992 | Glass et al. | 307/572 |
| 5,276,651 | 1/1994 | Sakamoto | 307/268 |

Primary Examiner—Timothy P. Callahan
Assistant Examiner—Tuan T. Lam
Attorney, Agent, or Firm—Harry A. Wolin

[57] ABSTRACT

A voltage converting circuit receiving an input voltage and an increased voltage and providing an output voltage higher than the input voltage at an output terminal, comprises a first pair of gate devices serially connected between the input voltage and a ground, a second pair of gate devices serially connected between the input voltage and the output terminal, a first capacitor connected between a node between the first pair of gate devices and a node between the second pair of gate devices for boosting the output voltage, a second capacitor connected between the output terminal and the ground for smoothing the output voltage, a control circuit for controlling said pairs of gate devices, and a pair of drivers for driving the second pair of gate devices respectively under the control of the control circuit. The pair of drivers are connected so as to operate between the increased voltage and the input voltage.

2 Claims, 1 Drawing Sheet

5,338,988

VOLTAGE CONVERTING CIRCUIT WITH LOW CONSUMPTION DRIVER

FIELD OF THE INVENTION

The present invention relates, in general, to a voltage converting circuit, and more specifically, to a voltage converting circuit with low consumption driver for use in a power supply system.

BACKGROUND OF THE INVENTION

There are many portable electronic devices and apparatus, especially in consumer electronics, that use a battery (cell) as their power source. The voltage supplied from the cell does not necessarily match the voltage level required in the electronic devices. Thus, a need exists to boost or convert the supplied voltage to a higher output voltage which is provided to internal circuits in the electronic devices. A typical voltage converting device employs so-called up-converter having NMOS gate transistors and capacitors for boosting voltage. In such up-converter, a voltage applied to the gate electrode of the NMOS transistor to turn on it is desired to be increased up to a level higher than the output voltage, in order to decrease on-resistance of the NMOS transistor to lower its power dissipation. Therefore, a driver such as an inverter was used, which operates between the increased voltage level and a ground level.

However, when such NMOS transistor turns off, electrical charge which has been stored in a parasitic capacitor at its gate electrode during on-status is discharged to the ground and lost. As the gate voltage of the NMOS transistor is made higher, the amount of the electrical charge lost to the ground becomes larger, resulting in high consumption of power.

Accordingly, it would be advantageous to have a voltage converting circuit having low consumption driver with maintaining low power dissipation.

SUMMARY OF THE INVENTION

Briefly stated, the present invention is a voltage converting circuit receiving an input voltage and an increased voltage, and providing an output voltage higher than the input voltage at an output terminal. The voltage converting circuit comprises a first pair of gate devices serially connected between the input voltage and a ground, a second pair of gate devices serially connected between the input voltage and the output terminal, a first capacitor connected between a node between the first pair of gate devices and a node between the second pair of gate devices for boosting the output voltage, a second capacitor connected between the output terminal and the ground for smoothing the output voltage, a control circuit for controlling said pairs of gate devices, and a pair of drivers for driving the second pair of gate devices respectively under the control of the control circuit. The pair of drivers are connected so as to operate between the increased voltage and the input voltage, but not the ground level.

DESCRIPTION OF A PREFERRED EMBODIMENT

Figure 1:
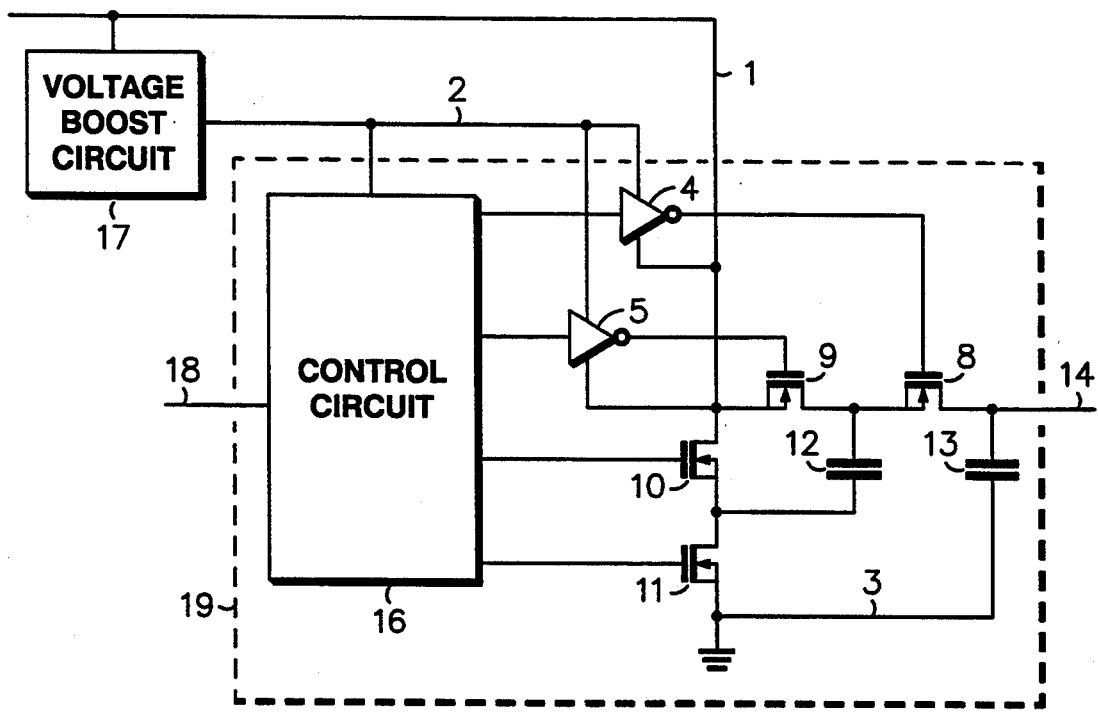
FIG. 1 shows a schematic diagram of a voltage converting system according to a preferred embodiment of the present invention.

FIG. 1 shows a schematic diagram of a voltage converting system 20 according to a preferred embodiment of the present invention. Voltage converting system 20 includes a voltage increasing circuit 17 and a voltage converting circuit 19. Voltage increasing circuit 17 receives an input voltage from an input voltage line 1 and provides an increased voltage higher than the input voltage onto an increased voltage line 2. Voltage increasing circuit 17 may be any type of circuit known in the art. Instead of one voltage increasing circuit, two separate voltage sources can be provided.

Voltage converting circuit 19 receives the input voltage from input voltage line 1, the increased voltage from increased voltage line 2, and a clock signal from a clock line 18. Voltage converting circuit 19 converts the input voltage to an output voltage which is higher than the input voltage, and provides the output voltage at an output terminal 14. Voltage converting circuit 19 includes a control circuit 16 receiving the increased voltage from increased voltage line 2 and the clock signal from clock line 18. Control circuit 16 operates synchronizing with the clock signal and provides control signals. Voltage converting circuit 19 further includes a first pair of NMOS transistors 10, 11 and a second pair of NMOS transistor 8, 9. Each of NMOS transistors 8, 9, 10 and 11 functions as a gate device. NMOS transistors 10 and 11 are serially connected between input voltage line 1 and a ground. NMOS transistors 10 and 11 are controlled by control circuit 16 and gated-on and gated-off in opposite phase to each other. NMOS transistors 8 and 9 are serially connected between input voltage line 1 and output terminal 14.

A pair of inverters 4 and 5 as drivers operate between the increase voltage and the input voltage under the control of control circuit 16 to drive transistors 8 and 9 respectively. Accordingly transistors 8 and 9 are gated-on and gated-off in opposite phase to each other. A first and second capacitors 12 and 13 are provided. The positive electrode of first capacitor 12 is connected to a node between transistors 8 and 9. The negative electrode of first capacitor 12 is connected a node between transistors 10 and 11. First capacitor 12 boosts a voltage at the node between transistors 8 and 9 as transistors 9 and 10 are repeatedly turning on and off in opposite phase to each other. The positive electrode of second capacitor 13 is connected to output terminal 14. The negative electrode of second capacitor 13 is connected to the ground. Second capacitor 13 smooths the output voltage appearing on output terminal 14.

Prior inverters corresponding to inverters 4 and 5 operated between the increased voltage and the ground, and therefore shorted gates of NMOS transistors to the ground when gating-off the transistors. When the gates of the NMOS transistors are shorted to the ground, electric charges which has been stored in parasitic capacitors at the gate electrodes of the NMOS transistors are lost to the ground and can not be recovered.

In this embodiment, when inverters 4 and 5 gate-off transistors 8 and 9 respectively, electric charges stored at the gate electrodes of transistor 8 and 9 are fed onto input voltage line 1 and recovered without being lost to the ground.

Figure 2:
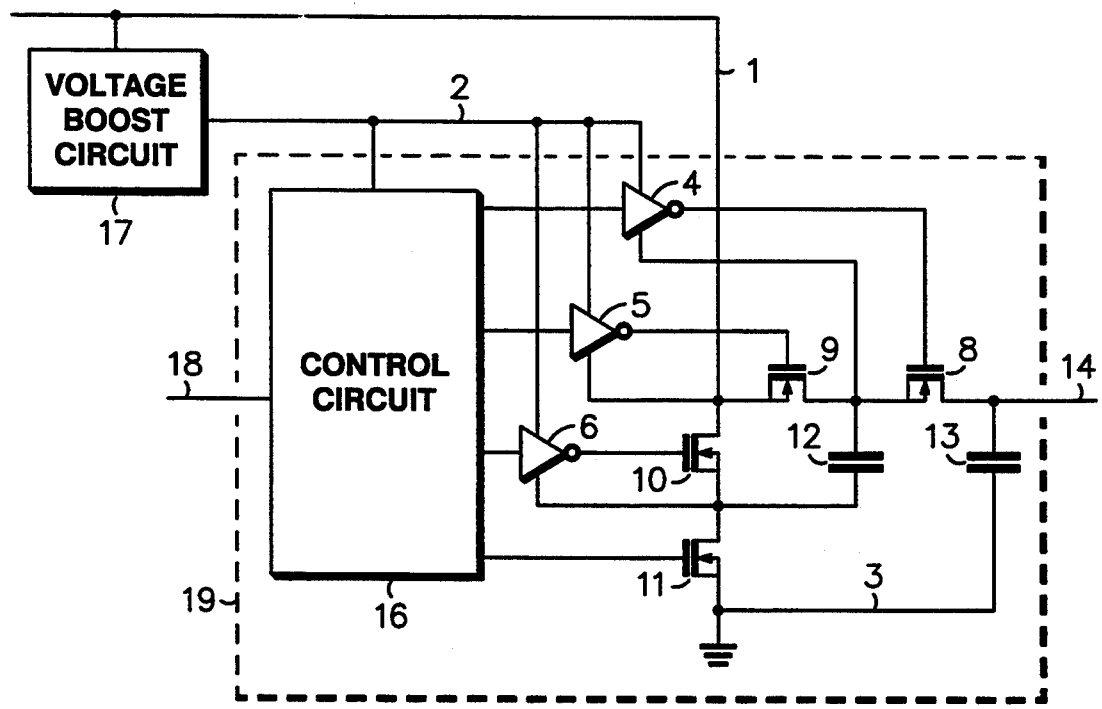
FIG. 2 shows a schematic diagram of a voltage converting system according to another preferred embodiment of the present invention.

FIG. 2 shows a schematic diagram of a voltage converting system 20 according to another preferred embodiment of the present invention. In FIG. 2, circuits and devices corresponding to those in FIG. 1 are indicated by the same reference number as in FIG. 1, and the same parts are not explained here. Inverters 4 and 6 are only different from FIG. 1 embodiment. In this FIG. 2 embodiment, first inverter 4 driving transistor 8 operates between the increased voltage and a voltage at the node between transistor 8 and 9 to avoid loosing electric charge to the ground. Inverter 6 operates between the increased voltage and a voltage at the node between transistors 10 and 11 to avoid loosing electric charge stored at the gate of transistor 10 to the ground.

According to the invention, electric charges accumulated at the gates of transistors can be recovered without being lost to the ground, resulting in low consumption. Further advantage is that noise can be reduced in these source follower transistors, the gate of which is shorted to its source not to the ground when gated-off.

We claim:

1. A voltage converting circuit receiving an input voltage from an input voltage line and an increased voltage higher than the input voltage from an increased voltage line, for providing an output voltage higher than the input voltage at an output terminal, comprising:

a first pair of gate devices serially connected between the input voltage line and a ground;
   a second pair of gate devices serially connected between the input voltage line and the output terminal;
   a first capacitor connected between a node between the first pair of gate devices and a node between the second pair of gate devices, for boosting the output voltage;
   a second capacitor connected between the output terminal and the ground for smoothing the output voltage;
   a control circuit for controlling said pairs of gate devices; and
   a pair of drivers connected so as to operate between the increased voltage and the input voltage, for driving the second pair of gate devices respectively under the control of the control circuit.

2. A voltage converting circuit receiving an input voltage from an input voltage line and an increased voltage higher than the input voltage from an increased voltage line, for providing an output voltage higher than the input voltage at an output terminal, comprising:

a first pair of gate devices serially connected between the input voltage line and a ground;
   a second pair of gate devices serially connected between the input voltage line and the output terminal;
   a first capacitor connected between a first node between the first pair of gate devices and a second node between the second pair of gate devices, for boosting the output voltage;
   a second capacitor connected between the output terminal and the ground for smoothing the output voltage;
   a control circuit for controlling said pairs of gate devices;
   a first driver connected so as to operate between the increased voltage and a voltage at the second node, for driving one gate device of the second pair of gate devices, which is closer to the output terminal, under the control of the control circuit; and
   a second driver connected so as to operate between the increased voltage and the input voltage, for driving the other gate device of the second pair of gate devices under the control of the control circuit.

* * * * *